United States Patent

Balamurugan

[11] Patent Number: 6,016,358
[45] Date of Patent: Jan. 18, 2000

[54] METHOD AND APPARATUS FOR ALIGNING THE POSITION OF DIE ON A WAFER TABLE

[75] Inventor: Subramanian Balamurugan, Singapore, Singapore

[73] Assignee: Texas Instruments Incorporated, Dallas, Tex.

[21] Appl. No.: 09/033,745

[22] Filed: Feb. 18, 1998

Related U.S. Application Data

[62] Division of application No. 08/667,246, Jun. 20, 1996, Pat. No. 5,851,848.

[30] Foreign Application Priority Data

Jan. 31, 1996 [SG] Singapore .......................... 9600739-8

[51] Int. Cl.⁷ .................................................. G06K 9/00
[52] U.S. Cl. ............................ 382/151; 348/87; 438/33; 438/14; 438/16
[58] Field of Search .................................... 382/151, 145; 348/87, 126; 356/375; 438/14, 16, 33

[56] References Cited

U.S. PATENT DOCUMENTS

| | | | |
|---|---|---|---|
| 4,929,893 | 5/1990 | Sato et al. ............................ | 382/151 |
| 5,592,573 | 1/1997 | Eisenbarth et al. ...................... | 382/151 |
| 5,694,482 | 12/1997 | Maali et al. ............................. | 382/151 |

*Primary Examiner*—Amelia Au
*Assistant Examiner*—Cedric Burgess
*Attorney, Agent, or Firm*—Robert L. Troike; Richard L. Donaldson

[57] ABSTRACT

A method for determining the position of a die on a wafer table after a wafer (20) has been cut includes stepping the wafer table (22) a series of one die lengths diagonally and after each step compare the die pattern to a reference die to determine street widths between dies. The widths are then averaged. This averaged street width is added to the die length to at the computer (26) to determine the jump distance between good dies. The distance from the reference die is continuously updated and this is used with the average street width to compute the next die position to jump. If the jump to the next die is unsuccessful, jump back to mid-point and if that is unsuccessful, reiterate mid-point jumps until successful.

4 Claims, 6 Drawing Sheets

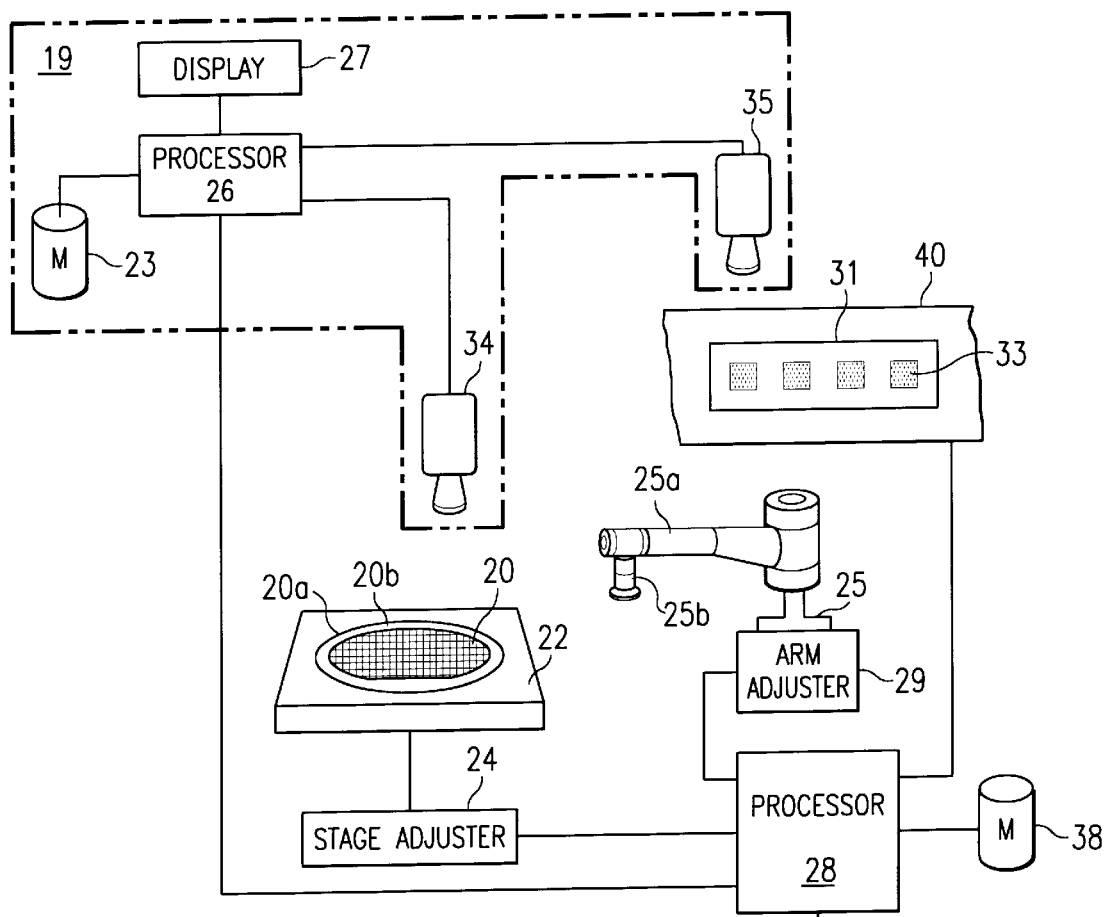
FIG. 1
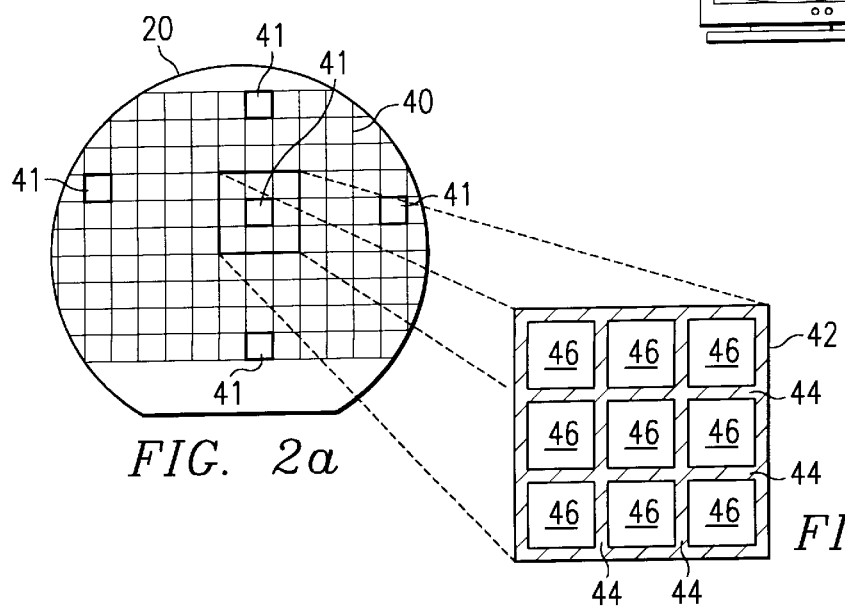
FIG. 2a
FIG. 2b

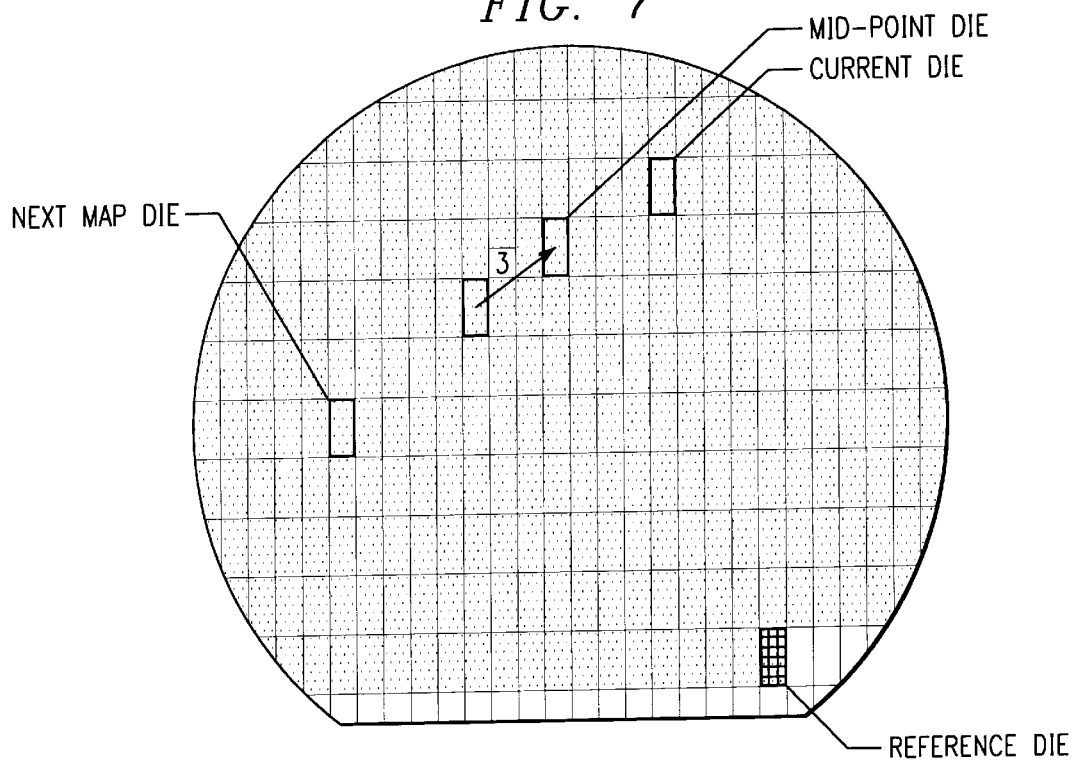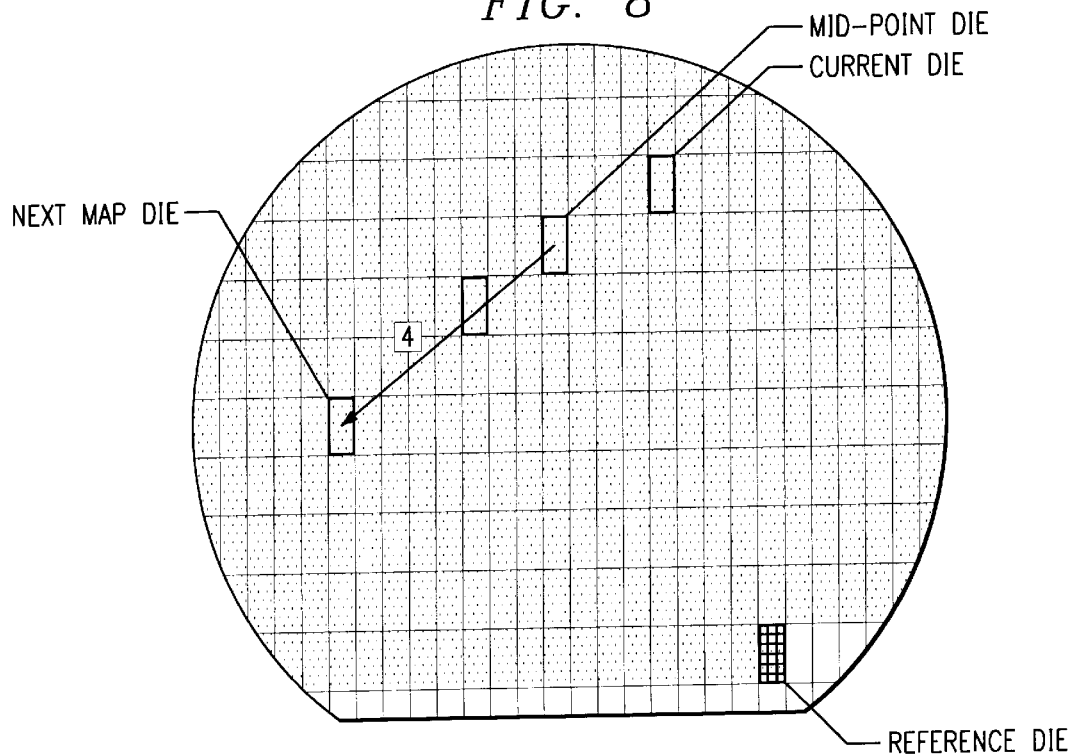

METHOD AND APPARATUS FOR ALIGNING THE POSITION OF DIE ON A WAFER TABLE

This is a divisional of application Ser. No. 08/667,246 filed on Jun. 20, 1996, U.S. Pat. No. 5,851,848.

TECHNICAL FIELD OF THE INVENTION

This invention relates to semiconductor circuit manufacturing and more particularly to apparatus and method for aligning the position of die located on a wafer table.

BACKGROUND OF THE INVENTION

Semiconductor manufacturing includes the process of die attached performed by a die bonder or die attach machine. The basic operation of die bonder is to mount dies on lead frames. The die bonder deposits epoxy on the lead frame pad, picks up a die, and places it on the lead frame die pad. The epoxy is a historic term and is actually an adhesive which uses no catalyst.

The die is picked up by suction. The good dies are individually picked up and placed on a lead frame. To do this the location of the die must be precisely known so the machine can pick up the die.

The silicon wafer provides several patterns, to form a plurality of semiconductor circuits. The individual integrated circuits on the wafer are separated by horizontal and vertical thoroughfares. The thoroughfares are border spaces between the semiconductor devices on the wafers. Along these thoroughfares are formed the saw streets when a cutter passes through them separating the individual circuits into what is termed "dies". This process is referred to as sawing. Before cutting the separate circuits, the back of the wafer is placed on a double backed tape which in turn is stretched like a drum over a ring base called flexframe on a controllable wafer table. The location of the dies on the original wafer is recorded on the wafer map stored in a memory. After sawing the wafer, the dies are moved. Hence moving the wafer table per the wafer map coordinates does not accurately position the wafer table for the next die to be picked. Small die wafer map operation on die bonder equipment is not feasible because of this. The variation in the saw street width across the wafer coupled with the tape shrinkage on partially picked wafers makes the one time correction of table jump distance for street width variation ineffective in ensuring the accurate table position.

SUMMARY OF THE INVENTION

In accordance with the teaching of the present invention, the street width in both horizontal and vertical directions is measured between a series of dies in orthogonal axes and these street widths are averaged to get an average street width value for the axes. This value is added to the nominal die dimensions to arrive at the distance the wafer must be moved relative to a die pickup mechanism.

These and other features of the invention that will be apparent to those skilled in the art from the following detailed description of the invention, taken together with the accompanying drawings.

DESCRIPTION OF THE DRAWINGS

FIG. 1 is a diagram of the system according to one embodiment of the present invention;

FIG. 2a and 2b illustrate a wafer and thoroughfares;

FIGS. 5–10 illustrate the next map die index procedure where FIG. 5 illustrates the first move from the current die to the next map die;

FIG. 6 illustrates second move to mid-point die because first move failed;

FIG. 7 illustrates the third move to new mid-point die because the second move failed;

FIG. 8 illustrates the fourth move to the next map die because the third move was fine;

FIG. 9 illustrates the fifth move to mid-point die because the fourth move failed;

FIG. 10 illustrates the sixth move to next map die because the fifth move is fine.

DETAILED DESCRIPTION OF THE INVENTION

Figure 3:
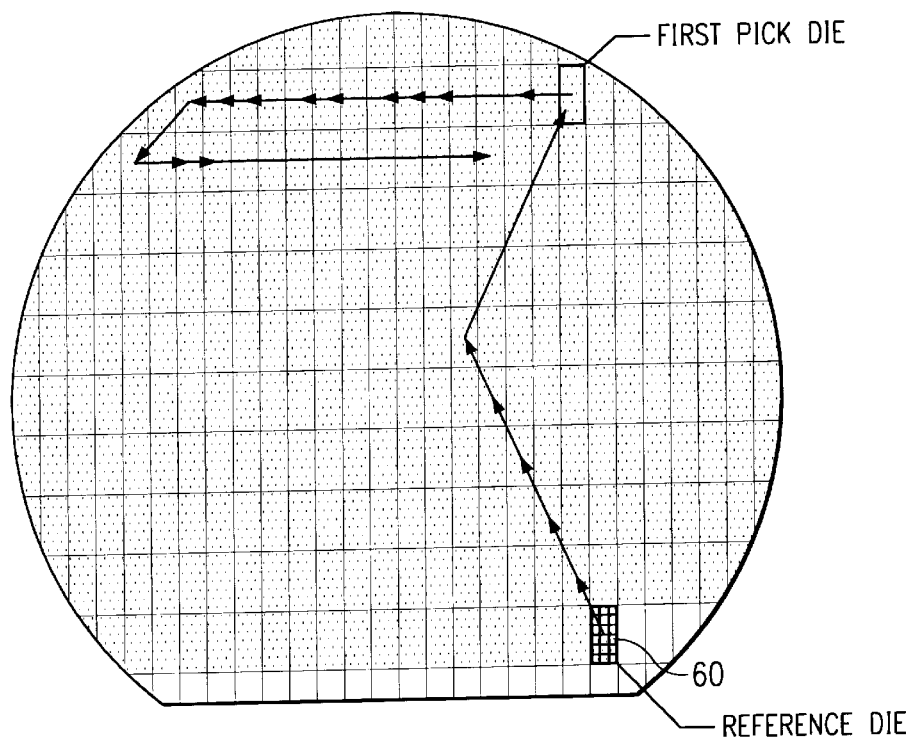
FIG. 3 illustrates the overall table indexing steps on a wafer.

Referring to FIG. 1, there is illustrated a schematic representation of an alignment system using a die bonder (die mounter or die attach) that may be used in the fabrication process of integrated circuits on silicon wafers according to the present invention. The die bonder may be, for example, Abacus 111D-SA Die Bonder of Texas Instruments Incorporated. A die bonder dispenses epoxy on a die pad of a lead frame and mounts the die to the pad. A silicon wafer 20 is carried by a table 22 which is moveable in conjunction with a table adjuster 24, which is coupled to table 22. A robot 25 of the system, including a controllable arm 25a and suction end effector 25b, picks up the die and places the die and on pad 33 of lead frame 31 by arm adjuster 29. The robot 25 is controlled by processor 28. The lead frame handling system 40 moves and positions the lead frame to allow placement of the die. The lead frame handling system 40 also applies the epoxy to the pad 33 of lead frame 31 before the die is placed on the lead frame 31. The wafer table 22 via the adjuster 24 moves the wafer 20 to locate the next die under program control of processor 28 so that robot arm 25a picks up the die from wafer 20 and places it on pad 33 of lead frame 31. After the table 22 is moved to one good die the align system 19 takes over for good alignment initiated by processor 28. The align system 19 consists of a processor 26, display 27, storage device 23, camera 34, and camera 35. The align system 19 provides an align correction signal to align a die accurately and is coupled to processor 28. During the alignment process, an output signal is produced by processor 26 and, the output signal may be delivered to the table adjuster 24 through processor 28 so as to reposition the wafer table in response to an output signal. The substance of the output signal may also be displayed by the processor 26 on the display 27. In order to perform the alignment or misregistration check, processor 26 receives a video image from a video camera 34 (such as a CCD camera) which is a subsystem of the alignment system. The camera includes the optics to focus on the wafer or lead frame. The video signal is digitized using, for example, a video to digital converter as part of the camera. Whenever an alignment is made, the processor 26 takes a picture via the camera 34 and looks for a pre-taught (stored) pattern. In one embodiment a unique pattern is in the die and is stored and when an alignment call is made the align system takes a picture and looks for that pattern. In another embodiment the align system takes a picture and aligns to the four sides (streets) of the die. The pattern of the integrated circuit is taught or stored in a memory of the processor 26 or memory or storage 23 at the time the device is setup. The processor 26 calculates the displacement of the stored pattern (alignment point) to current pattern and provides a correction signal. This displacement in x and y direction is the x and y correction. This correction signal dependent on the correction value through processor 28 is sent to the wafer table adjuster 24 from processor 26 for accurately positioning of the table so the die is picked up. If the displacement is too great so the stored pattern to current pattern is too great the align system 19 will not be able to do the alignment. It is therefore very important that before alignment is done, the wafer table 22 is moved close to the alignment point. The precise location of the lead frame 31 may be determined by align system 19 using a second camera 35 (such as a CCD video camera) also coupled to the processor 26. The wafer map identifying the locations of the dies and which dies are good or bad are stored in the wafer map in storage 38. When bad dies have been identified they are marked and the information is stored in the storage 38 so that the system coupled to the storage knows the bad dies and skips or jumps these bad dies. The align system 19 gives the correct distance to the wafer table adjuster 24 to move the table 22 if not aligned sufficiently for the pickup device to pick up the die. The robot arm 25a picks up the properly aligned die and places it on the pad of the lead frame. The lead frame handling system 40 then moves the next lead frame pad into position. The present application is particularly directed to the step of accurately moving the wafer table to every good die on the wafer so that the align system 19 can align the die properly and enable the robot arm 25 to pick up the good dies.

Referring to FIG. 2a there is shown silicon wafer 20 with a reducible layout 40 shown there on. An exploded section 42 shown in FIG. 2b shows four scribe line segments 44 defining chips 46. Although the pattern formed by the described segments shown in exploded section are uniform, it is to be understood that an exploded view on most all wafers would contain unique line segments. The line segments 44 are thoroughfares extending to both horizontal and vertical directions separating the separate integrated circuits or chips 41. The wafers before being cut are stuck on a double-backed tape 20b and the tape 20b is stretched over a support ring 20a as illustrated in FIG. 1. As the cutter passes through the thoroughfares 44 the saw streets are formed which separates the individual die pieces or chips. After the cutting of the wafer, the variation in saw street width coupled with the tape shrinkage due to pulling on the tape, the wafer table jump may not be accurate. This is particularly true for large jumps between good dies. The saw street width vary across the wafer in both axes due to uneven wafer mount tape expansion, saw blade variations, etc. There is also a change in distance between the dies, due to shrinkage of the tape on which the wafer is mounted, as the dies are picked off the wafer. After the sawing or cutting has occurred, the align system 19 and the processor 28 compute the average saw street width in both the horizontal and vertical axes.

Figure 4:
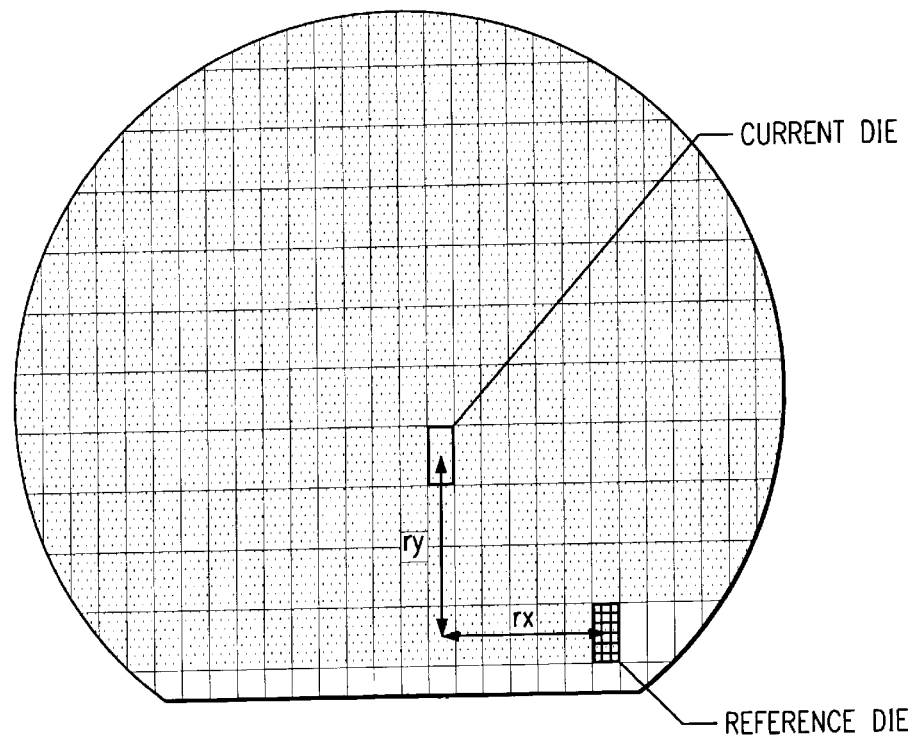
FIG. 4 illustrates the coordinates of the wafer.

As shown in FIG. 3, the overall procedure is to initially sample for the average street width computation before jumping to pick the first die. The wafer has a reference die 60 as shown in FIG. 3. The x and y distance is from the reference die 60 to the current die as shown in FIG. 4. The mid-points of the die is used. In applicant's preferred embodiment the system determines the average street widths by 5x and 5y corrections. This could be done by jumping five times up from the reference die and collect y corrections and jump five times left from the reference and collect x corrections. By jumping five times diagonally one can collect 5x and 5y corrections. In FIG. 3 five jumps are shown but seven jumps maybe desirable for more accuracy. The align system 19, after each die jump, performs alignment and determines the x and y corrections. The corrections are the street widths in x and y directions. These five (alternative 7) corrections for x and y directions are separately added up and divided separately by five (alternative 7) to get the average street widths in both x and y directions separately. For example, the die bonder knows the die size for a device so it moves the table 22 one die diagonally from the reference die 60. The die alignment using the align system 19 is made and the x and y correction is stored. This represents the x and y street width. The table is moved one die distance diagonally again and aligned again and the error represents the streets width. This is repeated moving one die diagonally, aligning and storing the correction. After collecting all x and y corrections (5 for the example) an average is determined by summing x and y corrections separately and separately dividing by five, if five measurements are taken, to get the average street width. The system then goes and picks up the first good die. Again it may be desirable to take seven measurement and average the seven. The system continuously updates the distance from the reference die 60 to the current die and uses this information and average street width information for the next jump. The known bad dies are jumped over. The bad dies are noted in the memory map in the storage 38. The next die position, from one reference die to the next, is computed using the following equation:

> Distance from Reference die is=the current die position−the reference die position.

This is represented in FIG. 4 where $r_x$ is equal to the distance in the horizontal direction from the reference die and $r_y$ represents the distance from the reference die in the vertical direction.

The next die position is equal to:

> the distance from the reference die+(the next die−the current die)*(the average street width+the die size). The symbol * refers to multiplication.

Figure 5:
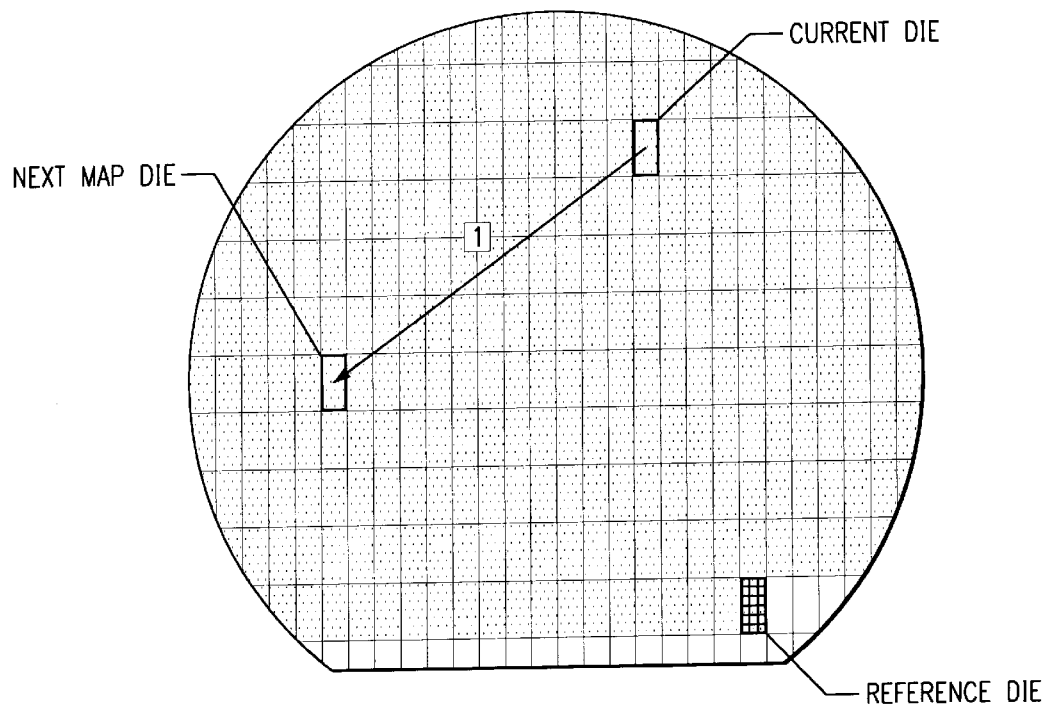
Figure 6:
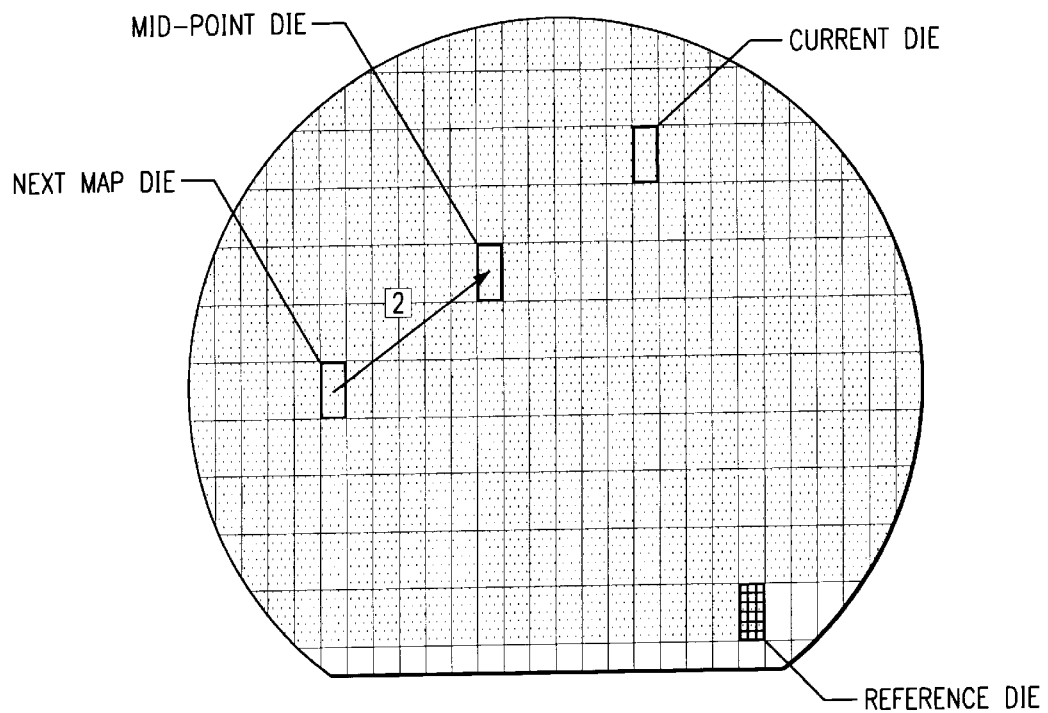
Figure 9:
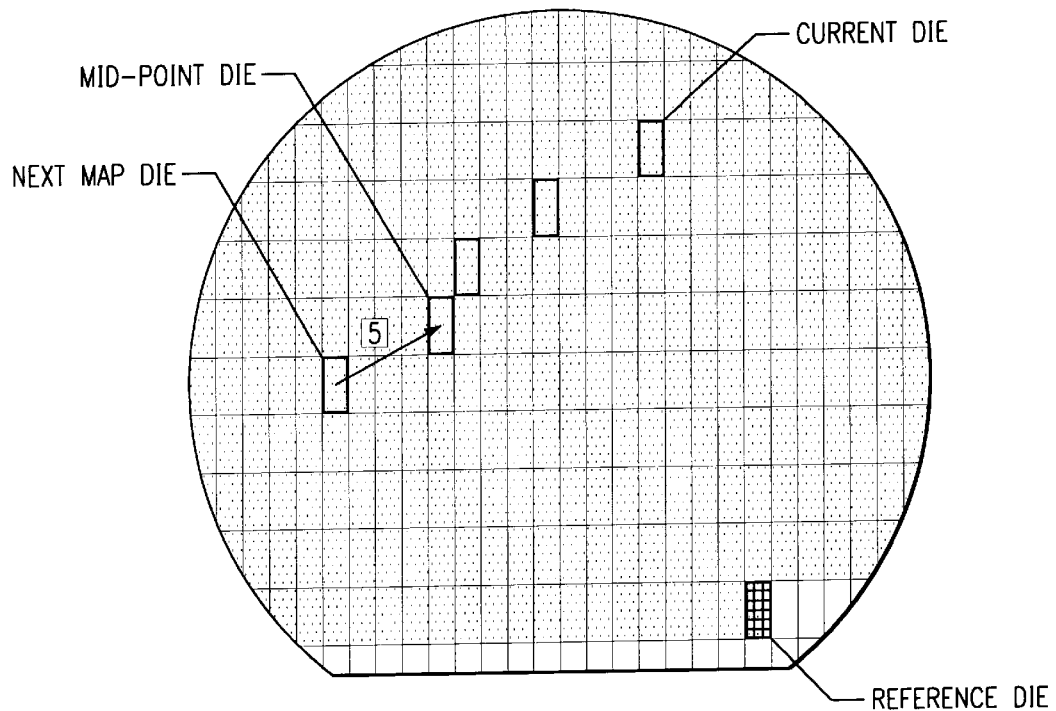
Figure 10:
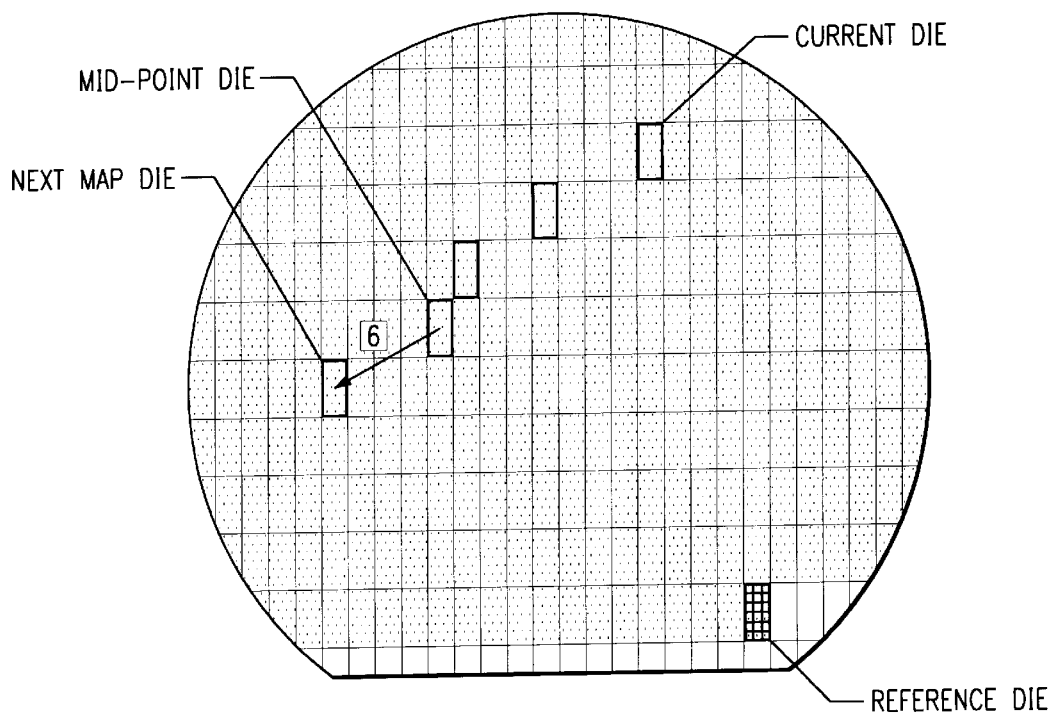
Figure 11:
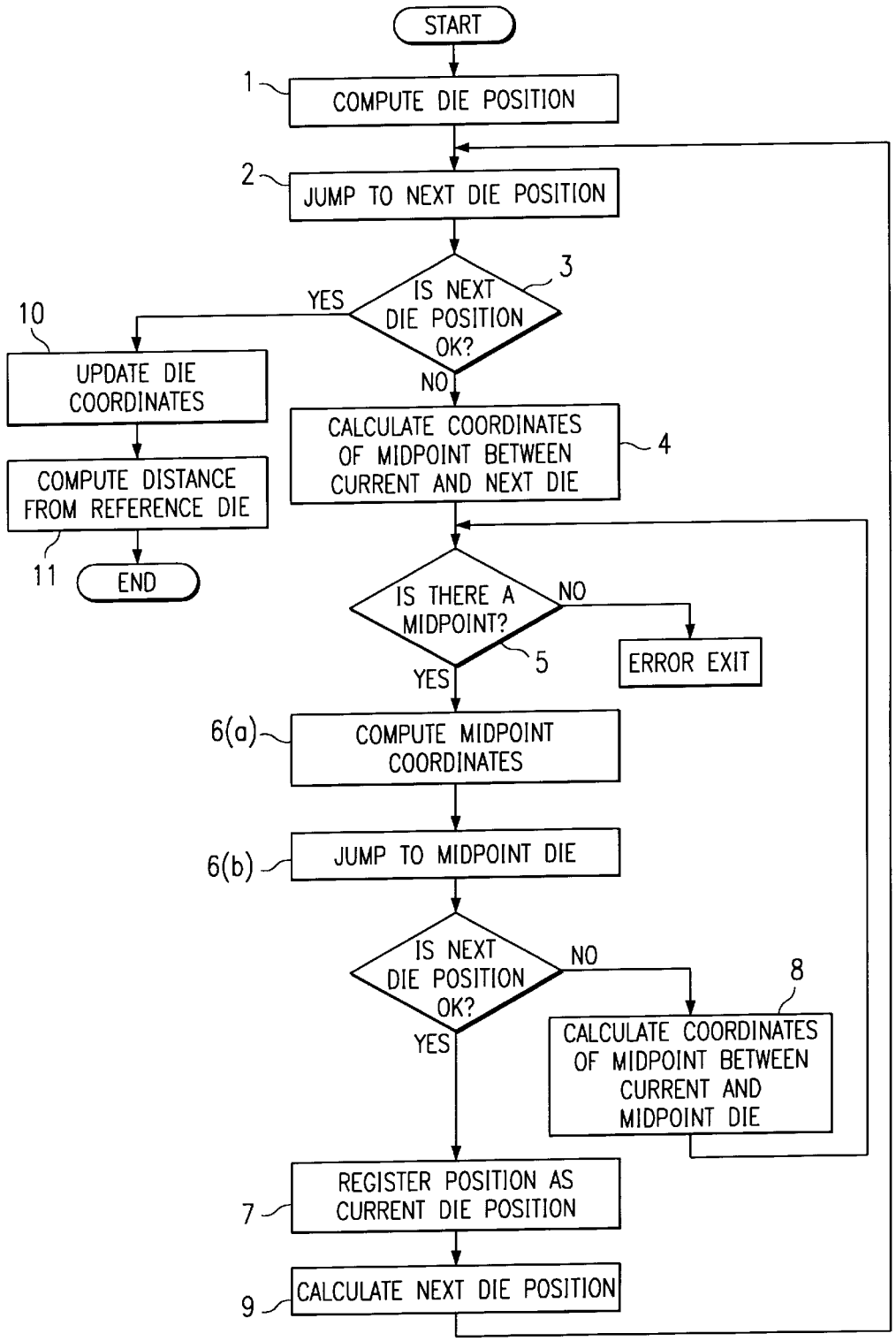
FIG. 11 is a flow chart of the program for the jump operation.

For long jumps, if direct jump is unsuccessful it will jump to the mid-point. The jump is unsuccessful when alignment fails as discussed above. That is the stored unique die pattern or the four sides of the die don't align with the camera picture within a degree of tolerance. The system will reiterate until successful using the procedure illustrated in FIGS. 5–10. The first move from current die to next map die is shown in FIG. 5. The second move (FIG. 6) is to the mid-point die because the first move failed. The third move (FIG. 7) is to a new mid-point die because the second move failed. The fourth move (FIG. 8) is the next map die because the third move is fine. The fifth move (FIG. 9) is to mid-point die because the fourth move failed. The sixth move (FIG. 10) is to next map die because fifth move is fine. In accordance with the flow chart of FIG. 11 the operation of the processor 28 containing the program is as follows:

| Steps | Action |
|---|---|
| 1. | Compute next die position. |
| 2. | Jump to the next die position. |
| 3. | If the next position is accurate, then go to step 11. |
| 4. | If not calculate the corrdinates of the midpoint between the current and next die. |
| 5. | If no midpoint coordinates, then error exit. |

| Steps | Action |
|---|---|
| | For Example: Between the coordinates 5, 6 and 5, 7 there is no midpoint coordinates. |
| 6. | Compute midpoint coordinate position and jump to midpoint die. |
| 7. | If die position is accurate, then this position is registered as a current die position and go to step nine. |
| 8. | If the die position is not accurate, then calculate the coordinates of the midpoint between the current and midpoint die and then go to step 5. |
| 9. | Calculate the next die position and jump to the next die position. |
| 10. | If die position is not accurate, then go back to step 4. |
| 11. | Update current die coordinate. |
| 12. | Compute distance from reference die. |

A set pseudo code for the program is provided herewith as follows.

```
INDEX_NEXT_MAP_DIE(current_die,next_map_die)
{
    next_die = next_map_die;
    next_die_position = CALCULATE_NEXT_DIE_POSITION
    (current_die,next_die);
    JUMP_TABLE(next_die_position);
    align_value '2 ALIGN_DIE();
    IF(align_value ==ALIGN_OK)
    {
        UPDATE_CURRENT_DIE_COORDINATES();
        UPDATE_DISTANCE_FROM_REF_DIE();
        RETURN (0);
    }
    mid_point_die = (next_die − current_die) /2;
    IF(mid_point_die == 0)
    {
        ERROR IN FINDING NEXT MAP DIE
        RETURN (1);
    }
    DO_FOR_EVER:
    {next_die_position = CALCULATE_NEXT_DIE_POSITION
    (current_die;mid_point_die);
    JUMP_TABLE(next_die_position);
    align_value = ALIGN_DIE();
    IF(align_value == ALIGN_FAIL)
    {
        next_die = mid_point_die;
        mid_point_die = (next_die − current_die) /2;
        IF(mid_point_die == 0)
        {
            ERROR IN FINDING NEXT MAP DIE
            RETURN (1);
        }
        GO TO DO_FOR_EVER;
    }
    current_die = mid_point_die;
    next_die '2 next_nap_die;
    next_die_position = CALCULATE_NEXT_DIE_POSITION
    (current_die;next_die);
    JUMP_TABLE(next_die_position);
    lign_value = ALIGN_DIE();
    IF(align_p_balue ==ALIGN_OK)
    {
        UPDATE_CURRENT_DIE_COORDINATES();
        UPDATE_DISTANCE_FROM_REF_DIE();
        RETURN (0);
    }
    mid_point_die = (next_die − current_die) /2
    IF(mid_point_die ==0)  {
        ERROR IN FINDING NEXT MAP DIE
        RETURN (1);
    }
    GO TO DO_FOR_EVER;
}
CALCULATE_NEXT_DIE_POSITION(current_die,next_die)
{
    next_die_position = DISTANCE_FROM_REFERENCE_DIE +
            (next_die − current_die) *
            (average_street_width + die_size);
    RETURN (next_die_position);
}
UPDATE_DISTANCEhd —FROM_REF_DIE()
{
    DISTANCE_FROM_REFERENCE_DIE = current_die_position −
    reference_die_position;
}
UPDATE_CURRENT_DIE_COORDINATES()
{
    current_die '2 next_map_die;
}
```

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. An apparatus for relative positioning a die on a wafer table to a die pick up device after cutting a wafer into dies comprising, in combination:

means for repeatedly measuring street width between a series of dies for both horizontal and vertical axes;

means coupled to said measuring means for averaging said street widths, and for generating a control signal proportional to an average street width plus a nominal die dimension; and means coupled to said wafer table and responsive to said control signal to move the relative position of the die on the wafer table with respect to the die pickup device a distance proportional to the average street width plus a nominal die dimension.

2. The apparatus of claim 1 wherein said means for sampling and measuring includes a storage for storing a reference die pattern means, for stepping the position of the wafer table a nominal die length to a stepped die and generating a stepped die pattern and means for comparing said stepped die pattern to said reference die pattern to measure the street width.

3. The apparatus of claim 2 wherein said stepping means includes means for stepping a nominal die length along a diagonal.

4. An apparatus for positioning the dies on a wafer table comprising:

a controllable driven wafer table adapted to hold and position dies thereon after the wafer is cut forming streets or gaps between the dies, said controllable wafer table being moved one die length along a diagonal from a reference die;

a camera for viewing said dies on the wafer table positioned to view said dies moved one die length from the reference die;

a memory storing an image of a standard die;

a processor coupled to said camera and said memory for comparing said image of said standard die and the image from said camera to determine any the street width for that die; and said processor adding said street width to the nominal dimension of said die to determine the position of the die.

* * * * *